(12) United States Patent
Yuzuriha et al.

(10) Patent No.: US 6,682,985 B2
(45) Date of Patent: Jan. 27, 2004

(54) SEMICONDUCTOR DEVICE AND MANUFACTURING METHOD THEREOF

(75) Inventors: Kojiro Yuzuriha, Hyogo (JP); Naoki Tsuji, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 119 days.

(21) Appl. No.: 10/040,633

(22) Filed: Jan. 9, 2002

(65) Prior Publication Data

US 2003/0001201 A1 Jan. 2, 2003

(30) Foreign Application Priority Data

Jun. 29, 2001 (JP) ........................................ 2001-198849

(51) Int. Cl.$^7$ .............................................. H01L 21/76
(52) U.S. Cl. ...................... 438/425; 438/405; 438/424; 438/692
(58) Field of Search ................................ 438/405, 424, 438/425, 426, 427, 435, 443, 444, 445, 448, 691, 692, 428, 695, 696, 702, 704, 8, FOR 227; 257/635, 640, 510, 513

(56) References Cited

U.S. PATENT DOCUMENTS 5,933,748 A * 8/1999 Chou et al. ................. 438/431
6,090,684 A * 7/2000 Ishitsuka et al. ............ 438/424

FOREIGN PATENT DOCUMENTS

JP          10-303291       11/1998
JP          10-340950       12/1998
JP          2000-68365       3/2000

OTHER PUBLICATIONS

"Improved Shallow Trench Isolation using Poly-Si–buffered structure", English Translation, Y. Mizuo et al., Presentation of Papers of the 58th Meeting of the Applied Physics Society, 2a–K–9, Oct. 1997.

* cited by examiner

Primary Examiner—W. David Coleman
Assistant Examiner—Julio J. Maldonado
(74) Attorney, Agent, or Firm—McDermott, Will & Emery

(57) ABSTRACT

A semiconductor device as well as a method of manufacturing a semiconductor device wherein a wide trench separation band is formed without causing the scooping out of the silicon substrate can be gained.

The process is provided with the step of forming a multilayer film on a silicon substrate, the step of patterning the multilayer film and of etching the silicon substrate so as to create a trench, the step of forming an inner wall silicon oxide film on the inner wall surface of the trench, the step of forming a trench oxide layer so as to fill in the trench, the step of polishing the trench oxide layer through CMP polishing so as to expose the silicon nitride layer and the step of etching the trench oxide film, which has undergone the CMP polishing, by a thickness no more than the thickness of the inner wall silicon oxide film.

13 Claims, 16 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, in particular, to a semiconductor device, which has a trench separation band, and a manufacturing method thereof.

2. Description of the Background Art

Insulating separation bands are provided in many places of a semiconductor substrate in a semiconductor device such as a DRAM (dynamic random access memory), an SRAM (static random access memory) and a flash memory. Though LOCOS (local oxidation of silicon) separation has been in conventional use, as the miniaturization of the above described semiconductor devices has progressed, trench separation bands suitable for miniaturization have come to be exclusively used for separation bands.

Next, a process for a general trench separation band is described in reference to the figures. First, a base silicon oxide layer ($SiO_2$ film) 102, whose thickness is, for example, 50 nm, is formed on a silicon substrate 101. Base silicon oxide layer 102 is formed for the purpose of height adjustment of the trench separation band. Then, a polycrystalline silicon layer 103, whose thickness is 100 nm, is deposited on the base silicon oxide layer. In addition, a silicon nitride layer (SiN film) 104, whose thickness is 300 nm, is deposited thereon (FIG. 15). Silicon nitride layer 104 functions as a stopper layer during CMP polishing.

After this, a photoresist pattern 105 is formed which corresponds to regions where the trench separation bands are desired to be provided. Then, silicon nitride layer 104 is patterned by using this photoresist pattern as a mask (FIG. 16). After this, photoresist pattern 105 is removed. Then, polycrystalline silicon layer 103 and silicon oxide layer 102 are etched by using patterned silicon nitride layer 104 as a mask. Furthermore, a trench 106, whose depth is, for example, 0.5 μm, is created in the silicon substrate by using these patterns as a mask (FIG. 17). Polycrystalline silicon layer 103 makes it easy for an inner wall silicon oxide film to be formed. In addition to this, polycrystalline silicon layer 103 protects the silicon substrate at the time when the silicon oxide film filled into the trench separation band is etched.

After this, the damaged layer on the trench surface is removed and, after that, a silicon oxide film (hereinafter referred to as inner wall oxide film) 107 is formed in the inner wall of the trench with a thickness of, for example, 120 nm (FIG. 18). This inner wall oxide film 107 functions as a short circuit prevention insulating film of silicon substrate 101 as described below. In addition, at the same time, it functions as a layer that relieves stress due to the difference in the thermal expansion coefficients of the filled-in silicon oxide film (hereinafter referred to as filled-in oxide film), which is filled into the trench, and silicon substrate 101.

Next, the above described filled-in insulating layer 108 is deposited with a thickness of 1 μm so as to fill in trench 106, on which inner wall oxide film 107 has been formed (FIG. 19). After this, CMP polishing is carried out by utilizing slurry, whose main component is silicon oxide ($SiO_2$). As for CMP polishing, the polishing rates within the wafer surface area are taken into consideration and polishing is carried out until, at least, silicon nitride layer 104 is exposed (FIG. 20).

At the time of this CMP polishing the unevenness of the polishing rates is taken into consideration and over-etching is carried out to the degree of 10% of the thickness of an HDP (High Density Plasma) film. As a result of this over-etching, in some regions 100 nm of silicon nitride layer 104 is polished off. After this, etching is carried out by using an HF liquid so as to make filled-in oxide film 108 lower by 250 nm for the purpose of adjustment of the height of the trench separation (FIG. 21). Next, the silicon nitride layer, the polycrystalline silicon layer and the base silicon oxide layer are removed. As a result of this, as shown in FIG. 22, a trench separation band, whose height from the silicon substrate surface is approximately 50 nm, that is, in the range of 0 nm to 100 nm, can be formed.

A trench separation band which has a conventional width can be formed by using the above described method. In the formation of the trench separation band with a conventional width, as shown in FIG. 20, the top surface of the trench oxide film and the top surface of the silicon nitride layer become a shared surface.

When a trench silicon oxide layer (hereinafter referred to as trench oxide layer or trench oxide film) is filled into a wide trench in order to form a wide trench separation band by means of the above described method, however, trench oxide layer 108 in a form as shown in FIG. 23 is formed. After this, the trench oxide layer is polished through CMP polishing and silicon nitride layer 104 is exposed. At this time, the top surface of trench silicon oxide film (hereinafter referred to as trench oxide film or trench oxide layer) 108 of the wide trench becomes lower than the top surface of silicon nitride layer 104 so as to form a recess in a dish form (FIG. 24). This trench oxide film is, in some cases, referred to as a filled-in oxide film in the description hereinafter. Concretely, the top surface of filled-in oxide film 108 of the wide trench is, for example, 100 nm lower than the top surface of silicon nitride layer 104.

After this, etching is carried out by using an HF liquid so as to reduce the thickness of the filled-in oxide film by, for example, 250 nm for the purpose of adjustment of the height of the trench separation band. In some cases as a result of this etching by using the HF liquid, as shown in FIG. 25, silicon substrate 101 is exposed beneath an edge portion of base silicon oxide layer 102 in the upper portion of a sidewall of the wide trench. After this, when polycrystalline silicon layer 103 is removed through etching, the exposed portion of the silicon substrate, which is also made of silicon, is etched. As a result of this, the exposed portion of silicon is scooped out in an inward direction and, as shown in FIG. 26, a cavity 111 is created.

In the case that such a scooping out occurs, the wide trench separation band cannot sufficiently function so as to isolate, without fail, respective regions in the silicon substrate by means of an insulating layer. Therefore, a short circuit, or the like, occurs.

A phenomenon wherein a silicon substrate is scooped out due to etching of a filled-in oxide film in a trench separation band, as described above, is known conventionally and several methods for preventing the silicon substrate from being scooped out have been proposed. For example, a method has been proposed wherein the filled-in oxide film is etched after being flattened through polishing so that the difference in the levels of the oxide film in the active region on which semiconductor elements are to be formed (Japanese Patent Laying-Open No. 2000-68365). In this method, however, the creation of a recess in a dish form is not supposed to occur through CMP polishing of the filled-in insulating layer of the wide trench separation band. Therefore, it cannot be used for the formation of the wide trench separation band which is the subject of the present invention.

In addition, a method has been proposed wherein a thermal oxide film, which has strong withstanding properties against etching, is formed not only on the inner walls of the trench but, also, on the side surfaces of the filled-in oxide film which protrudes above the silicon substrate surface (Japanese Patent Laying-Open No. 10-340950). However, this method is not effective in the case that a recess in a dish form occurs through CMP polishing in the filled-in insulating layer of the wide trench separation band.

In addition, in the case that intervals of active regions 130 wherein semiconductor elements are formed become wide, a structure as shown in FIG. 27 is conventionally provided since wide separation regions cannot be manufactured. In FIG. 27 a number of dummy active regions 125 are aligned between active regions 130 so that trench separation band 110 is formed among the regions. The base part is strengthened because of the alignment of dummy active regions 125 so that a recess in a dish form does not occur after the CMP polishing process. Length $L_1$ of one side of the above described dummy active regions is, for example, 2 $\mu$m to 5 $\mu$m, intervals $S_1$ between dummy active regions are, for example, 2 $\mu$m to 5 $\mu$m and intervals $S_2$ between dummy active regions and active regions 130 wherein semiconductor elements are formed are, for example, 2 $\mu$m to 10 $\mu$m.

In the case that the above described dummy active regions are formed it is necessary to prepare a fine, complex pattern on a CAD. In many cases this task on CAD is complex and time consuming.

Furthermore, in the case that wires are arranged on the separation bands, as shown in FIG. 28, one wire is divided into two wires 131, 132 and dummy active regions are aligned in the separation bands in order to avoid the formation of a large separation band. Size $L_1$ of the dummy active regions in FIG. 28 is, for example, 2 $\mu$m to 5 $\mu$m, intervals $S_1$ between the dummy active regions are, for example, 2 $\mu$m to 5 $\mu$m, and distances $S_3$ between the dummy active regions and the wires are, for example, 2 $\mu$m to 10 $\mu$m.

In the case that a structure as described above is adopted, (a) the layout of wires 131, 132 become greatly limited and (b) useless regions, that is to say regions of the width ($L_1+2S_3$), are formed between the wires. Such useless regions have become a great hindrance to the miniaturization of semiconductor elements.

SUMMARY OF THE INVENTION

The main purpose of the present invention is to provide a manufacturing method of a semiconductor device wherein a trench separation band, wherein no scooping out of the silicon substrate occurs, is formed even when the trench separation band is a wide trench separation band and to provide a semiconductor device which includes such a trench separation band. By achieving this main purpose it becomes unnecessary to arrange complex dummy active regions and a secondary purpose of the invention is to divide wires so as to make it unnecessary to form useless regions.

A manufacturing method of a semiconductor device of the present invention is provided with the steps of forming a multilayer film which includes a silicon oxide layer on the main surface of a silicon substrate, a polycrystalline silicon layer positioned in a layer above the silicon oxide layer and a silicon nitride layer positioned in a layer above the polycrystalline silicon layer. This process is further provided with the step of patterning the multilayer film and, in addition, etching the silicon substrate to create a trench for element separation, the step of oxidizing the surfaces of the inner walls of the trench which includes the sidewalls of the multilayer film so as to form an inner wall silicon oxide film which covers the inner walls and the step of forming a trench oxide layer which fills in the trench covered by the inner wall silicon oxide film and which contacts the top surface of the silicon nitride layer. In addition, this process is provided with the step of polishing the trench oxide layer and the silicon nitride layer through CMP polishing so as to expose the silicon nitride layer to the predetermined thickness of the thickness of the silicon nitride layer and the step of etching the trench oxide film, which is formed by polishing the trench oxide layer through CMP polishing, by a thickness no more than the thickness of the inner wall silicon oxide film for the purpose of adjustment of the height of the trench separation band.

In the above described structure, the silicon substrate is not exposed through etching for the purpose of height adjustment, however the deep central portion of the top surface of the trench oxide film (filled-in oxide film) becomes through the creation of a recess in a dish form by means of a CMP polishing process in the wide trench separation band. In the wide trench separation band the edge portions of the silicon substrate are protected by the inner wall oxide film, which is not changed after formation, and by the trench oxide film, wherein a recess is created in a dish form and which sits on the inner wall oxide film before the etching for height adjustment. That is to say, the edge portions of the silicon substrate are protected by, at least, the inner wall silicon oxide film, which is not changed after formation. In the case that the trench oxide film is etched by a thickness no more than the thickness of the inner wall silicon oxide film through etching for height adjustment, the inner wall silicon oxide film, which is also made of silicon oxide, is not etched completely. Therefore, the edge portions of the silicon substrate are not exposed through the etching for height adjustment of the trench separation band.

After this, a selective etching is carried out for removing the polycrystalline silicon layer on the silicon substrate. In the case that the edge portions of the silicon substrate are exposed, the silicon substrate is etched and is scooped out by the etching liquid for etching the polycrystalline silicon. However, the edge portions of the silicon substrate are not exposed and, therefore, the silicon substrate is not scooped out through this etching.

After removing this polycrystalline silicon layer, the silicon oxide layer as the base is removed through etching and at this time though the trench oxide layer, which is also made of silicon oxide, is etched, the silicon substrate is not etched. Therefore, the silicon substrate is not scooped out.

In summary, in the above structure the edge portions of the silicon substrate are neither exposed after the etching for height adjustment of the trench separation band nor before the etching of the polycrystalline silicon and, therefore, the silicon substrate is not scooped out. Here, in the above described multilayer film, a polycrystalline silicon layer is arranged between the silicon nitride layer, which becomes a stopper layer at the time of CMP polishing, and the base silicon oxide layer, and the reasons for this are as follows. At the time of oxidation processing of the inner walls for forming the inner wall silicon oxide film, the inner wall silicon oxide film is formed through the oxidation of the edge portions of the polycrystalline silicon layer. The inner wall silicon oxide film formed in the edge portions of this polycrystalline silicon layer becomes upwardly raised from the main surface of the silicon substrate in the first trench separation band so that an electric field concentration can be avoided. The above described polycrystalline silicon layer is formed in this manner for the purpose of avoiding electric field concentration.

Here, the above described etching for height adjustment of the trench separation band is an etching for the purpose of adjustment of the height of the trench separation band of a conventional width wherein a recess in a dish form does not occur due to a CMP polishing process. At the time of this etching for height adjustment, a trench separation band of a conventional width is, of course, etched by the same thickness as of the trench oxide film of a wide trench separation band. This etching for height adjustment is adjusted according to the time of immersion in the etching liquid in accordance with the concentration, temperature, or the like, of the etching liquid. In addition, in the case of dry etching, the adjustment is carried out by changing predetermined adjustment factors concerning the etching thickness.

In the method of manufacturing a semiconductor device of the present invention, the sum of the thickness of the silicon nitride layer and the thickness of the polycrystalline silicon layer after CMP polishing can be made greater in comparison with the thickness of the inner wall silicon oxide film by a value no less than the difference gained by subtracting the amount of change of the maximum dispersion of the etching for the purpose of adjustment to a desired height from a desired separation height.

In this structure the silicon substrate is prevented from being scooped out in a wide trench separation band while the height, from the silicon substrate surface, of a trench separation band of the conventional width is made to be approximately 50 nm, that is, the height of the conventional separation band or to be in the range of 0 nm to 100 nm. That is to say, in the trench separation band of the conventional width, the top surface of the trench oxide layer after a CMP polishing process is at the same level as the top surface of the silicon nitride layer. That is to say, when the thickness of the silicon nitride layer after CMP polishing is $t_1$, the thickness of the polycrystalline silicon layer is $t_2$ and the thickness of the silicon oxide layer is $t_3$, the top surface of the trench oxide layer after the CMP polishing process is at the height of $(t_1+t_2+t_3)$ from the silicon substrate surface.

After this, an amount of etching no greater than the thickness of the inner wall silicon oxide film is carried out for height adjustment. When the maximum value of thickness reduction through this etching is d, the height, from the silicon substrate surface, of the top surface of the trench oxide film after etching for height adjustment becomes $(t_1+t_2+t_3-d)$ After this, the trench oxide film is etched when the silicon oxide layer on the silicon substrate is removed through etching. At the time when the silicon oxide layer on the silicon substrate is removed through etching, the trench oxide film is etched by approximately the same thickness as of the silicon oxide layer. As a result, the height, from the silicon substrate surface, of the top surface of the trench oxide layer becomes $(t_1+t_2-d)$ It is desirable for this height to be approximately 50 nm, that is, the height of conventional separation band or, at least, to be in the range of 0 nm to 100 nm. Here, at the time of the etching for height adjustment, the thickness d of the inner wall silicon oxide layer is not etched but, rather, the maximum dispersion amount of the etching for height adjustment, that is to say, for example, the thickness is etched off to be reduced by approximately 20 nm.

In the method of manufacturing a semiconductor device of the present invention, it is preferable for the silicon nitride layer to be formed to a thickness which includes the thickness to be reduced in the CMP polishing.

In this structure the CMP polishing is stopped without fail by the silicon nitride layer, which is a stopper layer in the CMP polishing process and the multilayer film on the silicon substrate can be protected in the etching for height adjustment of the trench separation band.

In the method of manufacturing a semiconductor device of the present invention, the trench oxide layer can be formed so that the etching rate for the trench oxide film in the etching for height adjustment is greater than the etching rate of the inner wall silicon oxide film.

In this structure etching is carried out so as to reduce the trench oxide film to a predetermined thickness and, in addition, protection of the silicon substrate can be ensured by means of the inner wall silicon oxide film. Here, it is not desirable to make the etching rate of the trench oxide layer too small.

In the method of manufacturing a semiconductor device of the present invention, an oxide layer can be formed by using an HDP (high density plasma) method at the time of the formation of the trench oxide layer.

A silicon oxide layer (filled-in oxide film) of high density can be formed by means of an HDP method. Thereby, the insulation of the trench separation band can be ensured. As for this trench insulating layer, a TEOS (tetra ethyl ortho silicate) film may be formed or an HTO (high temperature oxidation) film may be formed by means of a CVD method instead of an HDP film.

In the method of manufacturing a semiconductor device of the present invention, fluoric acid can be used for the etching which is carried out for height adjustment of the trench separation band.

In this structure the trench oxide layer can be selectively etched at a high etching rate. In addition, dry etching may be used for the above described etching for height adjustment of the trench separation band. Though, in some cases, the trench oxide layer cannot be selectively etched through dry etching, the edge portions of the silicon substrate are not exposed as long as the trench oxide layer is etched by an amount that is no greater than the thickness of the inner wall silicon oxide film. The portions of the silicon substrate in the periphery portions of the trench are protected by the silicon nitride layer, the polycrystalline silicon layer and the silicon oxide layer. These portions are not removed as long as the inner wall silicon oxide film is not removed through etching.

In the method of manufacturing a semiconductor device of the present invention, the trench is created in a large separation band region of the silicon substrate, which includes at least one active region in the plan view, through the etching of the separation region between the external periphery walls of the active regions formed along the peripheries of respective active regions included in the large separation band region and the inner periphery walls of the large separation band region formed along the periphery of the large separation band region while the inner wall silicon oxide film is formed on the external periphery walls of the active regions and on the inner periphery walls of the large separation band region so that the trench oxide layer can be formed so as to fill in the above trench.

In this structure it becomes unnecessary to align dummy active regions in the large separation band region and the time consuming task of forming a complex pattern on, for example, a CAD system in order to design the semiconductor device becomes unnecessary.

In the method of manufacturing a semiconductor device of the present invention, the trench can be created in the silicon substrate in a band form so as to include wires contacting the top surface of the interlayer insulating film on the silicon substrate in the plan view.

Conventionally, wires cannot be provided on places where the occurrence of parasitic capacitance is expected because the width of the wires is great and the thickness of the interlayer insulating film is small. Accordingly, the wire layout is greatly limited. In the above structure wide trench separation bands can be provided in the silicon substrate directly below the wires and, thereby, the thickness of the insulating layer can be made very great so that the parasitic capacitance can be ignored. As a result of this, it becomes possible to enlarge the freedom of the wire layout so as to contribute to, for example, the miniaturization of the semiconductor device.

In the method of manufacturing a semiconductor device of the present invention, first and second wires are arranged side by side and the trench can be created as a region in a band form which includes the first and the second wires in the plan view.

In the case that two wires are provided as described above, a dummy active region is aligned between them in the plan view. This dummy active region between these wires is a useless region. In the above structure no dummy active region is arranged between the wires and this can contribute to the miniaturization of the semiconductor device. In addition, the wire layout can be freely carried out and this enlargement of the freedom of the layout can also contribute to the miniaturization of the semiconductor device.

A semiconductor device of the present invention is a device which is provided with a first trench separation band portion and a second trench separation band portion which is wider than the first trench separation band portion. This device is a semiconductor device wherein the first and the second trench separation bands portions are manufactured through any of the above described processes for a semiconductor device of the present invention.

In this structure a wide trench separation band is formed without scooping out the silicon substrate and the height of a trench separation band of the conventional width can be made to be the same height according to a prior art. Therefore, the large separation region, wherein dummy active regions are conventionally aligned, can be formed of the wide trench separation band portion of the present invention. As a result of this, it becomes possible to eliminate the CAD task for forming the alignment to the dummy active regions.

The semiconductor device of the present invention is a device which is provided with a first trench separation band portion and a second trench separation band portion which is wider than the first trench separation band portion on a silicon substrate. In this semiconductor device the position of the top surface of the first trench separation band portion is in a position approximately 50 nm, that is, in the range of 0 nm to 100 nm higher than the silicon substrate surface. In addition, the position of the top surface of the second trench separation band portion is in a position lower than the main surface of the silicon substrate, the thickness of the inner wall oxide film which covers the inner walls of the trench of the second trench separation band portion in the periphery portions of the trench is less than the thickness in the bottom portion of the trench and the second trench separation band portion has a width wherein a recess in a dish form occurs at the time of the CMP polishing of the silicon oxide film, which fills in the second trench portion.

In this structure even in the case that the second trench separation band portion is a large separation region with the width wherein a recess in a dish form occurs at the time of CMP polishing, a wide trench separation band can be formed without scooping out the silicon substrate. At this time, the height of the trench separation band of conventional width can be in a conventional height range. As a result of this, the large separation region can be formed without using dummy active regions so that it becomes possible to omit the CAD task for forming the alignment of the dummy active regions.

In the above described semiconductor device of the present invention, the width of the second trench separation band portion can be 6 $\mu$m even in the narrowest place.

Though even in the case of such a narrow width, conventionally, at least one dummy active region must be formed, in the above described structure dummy active regions can be eliminated.

In the above described semiconductor device of the present invention, an active region wherein a semiconductor element is provided is included in the region of the second trench separation band portion and the external periphery walls surrounding the active region are covered with an inner wall silicon oxide film so that the width of the second trench separation band portion is formed of the width of that silicon oxide film which fills in the second trench.

It becomes possible to form the above described large separation region, which includes an active region, of a wide trench separation band of the present invention. As a result of this, the steps of the formation of dummy active regions can be omitted. The width of the wide trench separation band, even in the case the wide trench separation band portion includes an active region, is determined by the width of the trench oxide film which fills in the trench.

The above described semiconductor device of the present invention has an interlayer insulating film and wires contacting the top surface of the interlayer insulating film above the silicon substrate and the second trench separation band is arranged so as to include the wires with band sides running along the wires in the plan view.

In this structure, in some cases, a parasitic capacitance is formed of the wires and the impurity regions in the silicon substrate with the insulating film placed between them so as to become a cause of malfunction of the semiconductor device. Therefore, in some cases, the wire layout is greatly limited. In the above structure the wire layout can be freely carried out. As a result of this, the freedom of layout of wires can be enhanced. Furthermore, it becomes possible, for example, to use this increase in freedom of wire layout for the miniaturization of the semiconductor device.

In the above described semiconductor device of the present invention, wires are formed of a plurality of wires which are parallel to each other and the second trench separation band can be arranged so as to include the plurality of wires with band sides running along the plurality of wires in the plan view.

In this structure the freedom of wire layout can be enhanced. Furthermore, dummy active regions, which occur as useless regions in the conventional structure, provided among the plurality of wires in the plan view can be omitted. As a result of this, it becomes possible to contribute to the miniaturization of the semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Next, the embodiments of the present invention are described in reference to the drawings.

(First Embodiment)

Figure 1:
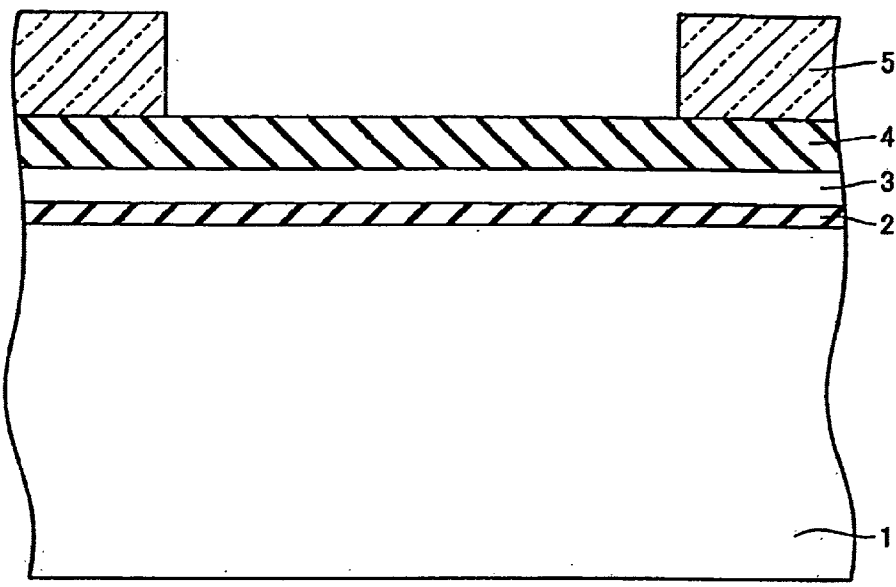
FIG. 1 is a cross section view at the stage when a base silicon oxide layer/polycrystalline silicon layer/silicon nitride film is formed on a silicon substrate in a method of manufacturing a semiconductor device according to a first embodiment of the present invention.

FIGS. 1 to 7 are views for describing a process for forming a wide trench separation band in a process according to a first embodiment of the present invention. First, an $SiO_2$ film 2 of a base silicon oxide layer for height adjustment is formed on a silicon substrate 1. Next, a polycrystalline silicon layer 3 is formed on the top surface of the $SiO_2$ film. Next, a silicon nitride layer 4 is formed on the top surface of polycrystalline silicon layer 3. This silicon nitride layer is made to be somewhat thin. In the present embodiment it is of a thickness of, for example, 150 nm (FIG. 1).

Figure 2:
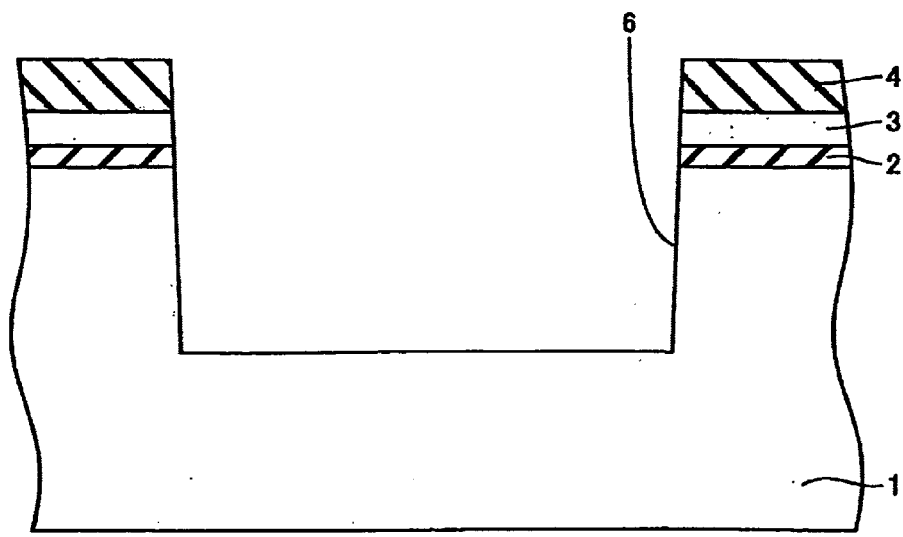
FIG. 2 is a cross section view at the stage when a wide trench is provided by arranging a photoresist pattern on the silicon substrate of FIG. 1.

After this, a photoresist pattern 5 for providing a wide trench is formed on silicon nitride layer 4. Next, this photoresist pattern 5 is used as a mask and silicon nitride layer 4 is etched. Furthermore, they are used as a mask and a wide trench 6 is provided in silicon substrate 1 (FIG. 2).

Figure 3:
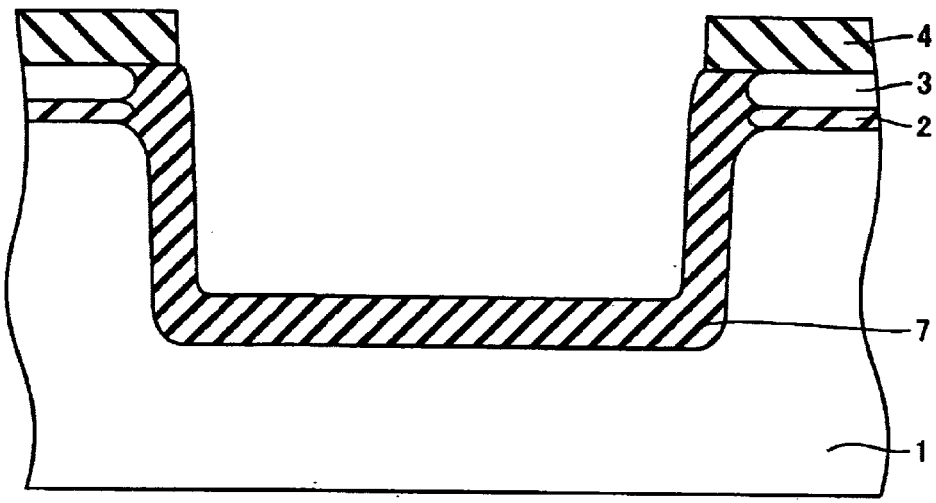
FIG. 3 is a cross section view at the stage when an inner wall oxide film is formed on the inner walls of the wide trench of FIG. 2.
Figure 4:
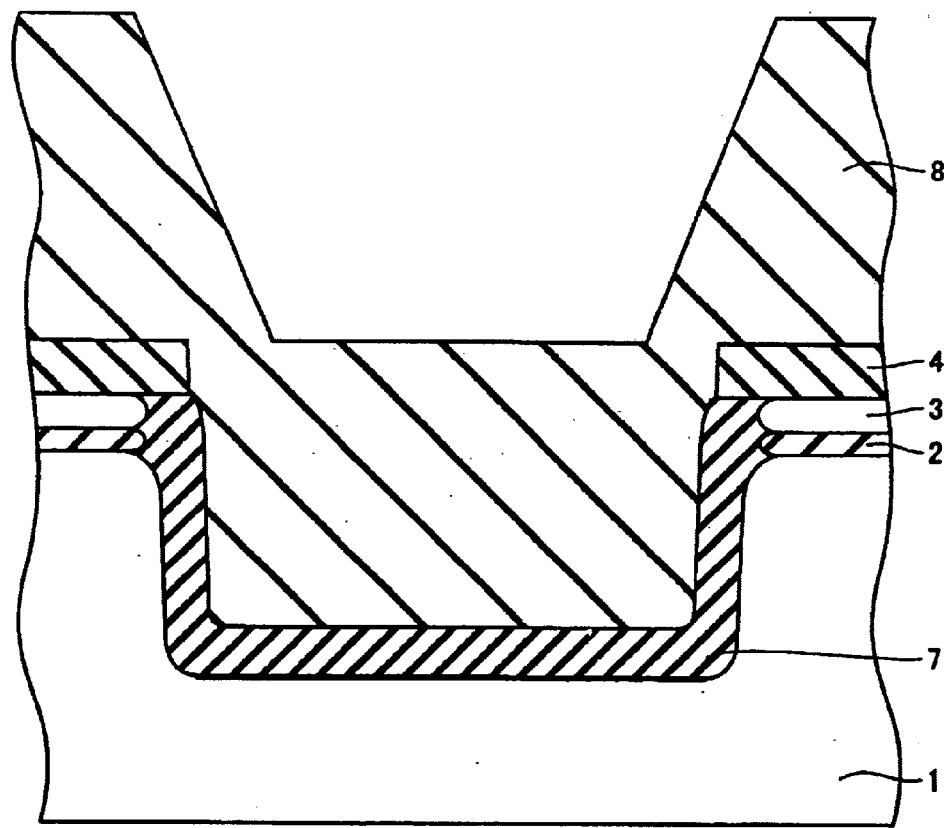
FIG. 4 is a cross section view at the stage when an HDP film is buried in the wide trench of FIG. 3.

After that, the inner wall surface of the wide trench is oxidized below silicon nitride layer 4 so that the trench inner wall surface is covered with an inner wall oxide film 7 (FIG. 3). The thickness of the inner wall oxide film is approximately 120 nm. At this time, silicon nitride layer 4 undergoes almost no oxidization. After this, a filled-in oxide film, of which the main component is silicon oxide ($SiO_2$) is formed so as to fill in the wide trench covered with the inner wall oxide film by means of an HDP (high density plasma) method. In the description below a silicon oxide film formed by using an HDP method is referred to as an HDP film. The thickness of HDP film 8 is approximately 1000 nm (1 μm) (FIG. 4).

At the time of the formation of the HDP film, argon (Ar), oxygen and silane ($SiH_4$), of which mixture ratio is $Ar/O_2/SiH_4$=(40 to 100)/(40 to 100)/(40 to 100) sccm, are used as gas components. At this time, the chamber temperature at the time of film formation is approximately 100° C.

The $SiO_2$ film may be filled in by means of chemical vapor deposition (CVD) without using high concentration plasma. In the case that a TEOS (tetra ethyl ortho silicate) film is filled in as the $SiO_2$ film according to this CVD method, the ratio of the gas mixture is $TEOS/N_2$=(80 to 120)/(180 to 220) sccm and the film is formed at 600° C. to 700° C. In addition, in the similar case wherein an HTO (high temperature oxidation) film filled in as the $SiO_2$ film according to the CVD method, the film is formed of DCS (di-chloro silane)/$N_2O/N_2$=(130 to 170)/(130 to 170)/(450 to 550) sccm at 720° C. to 780° C.

Figure 5:
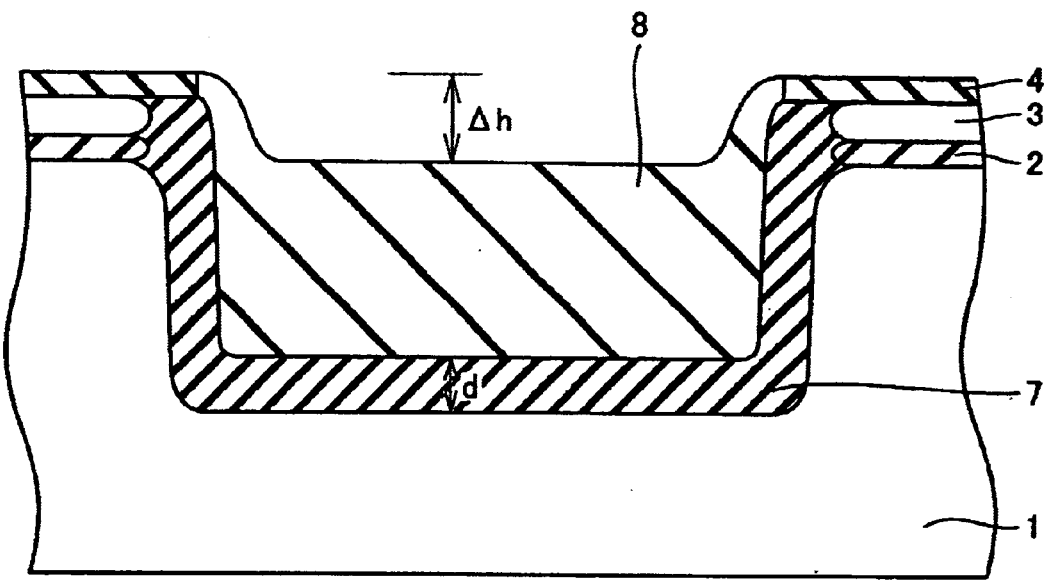
FIG. 5 is a cross section view at the stage when the HDP film on the silicon substrate of FIG. 4 is polished through CMP polishing.

After the above trench is filled in with the $SiO_2$ film, HDP film 8 and the silicon nitride film are polished through CMP polishing until silicon nitride film 4 is exposed. FIG. 5 is a diagram showing the condition where silicon nitride film 4 is exposed as a result of the above described CMP polishing. In FIG. 5, a recess in a dish form is created in the HDP film, which fills in the large separation trench through CMP polishing. The top surface of HDP film 8 is lower than the top surface of silicon nitride film 4 due to the above recess in a dish form.

In FIG. 5, the difference Δh between the heights of HDP film 8 and silicon nitride film 4 at the time of completion of CMP polishing becomes approximately 200 nm due to the recess in a dish form. As a result of this, the height of the top surface of HDP film 8 is approximately at the same height as the surface of silicon substrate 1.

Figure 6:
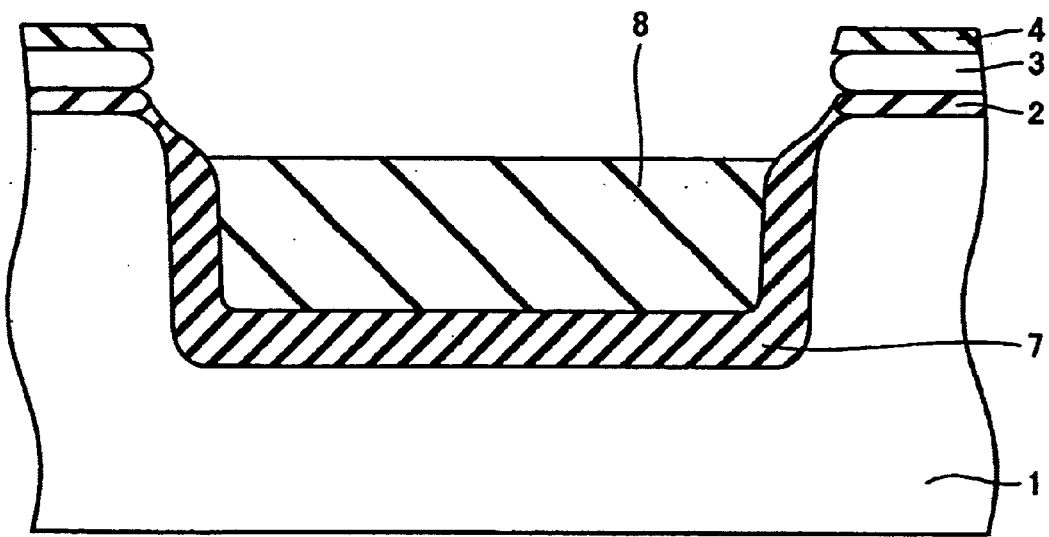
FIG. 6 is a cross section view at the stage when etching for adjusting the height of the HDP film is carried out on the silicon substrate of FIG. 5.
Figure 7:
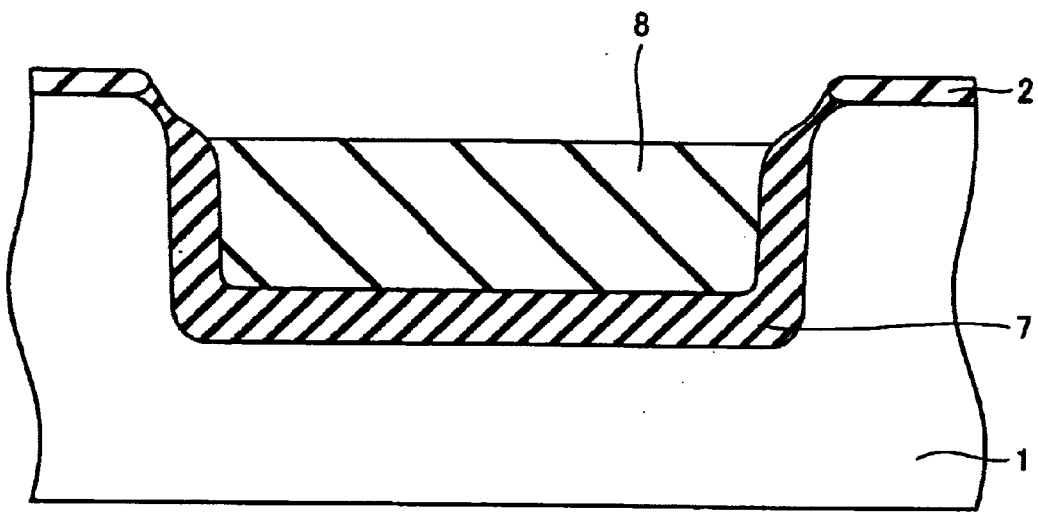
FIG. 7 is a cross section view at the stage when the silicon nitride layer and the polycrystalline silicon layer are removed from the silicon substrate of FIG. 6.

After this, in etching the HDP film by using fluoric acid for the purpose of height adjustment of the trench separation, the depth of etching is controlled to be approximately 100 nm, which is thinner than the thickness d of the inner wall oxide film (FIG. 6). In the etching for the purpose of height adjustment of the filled-in oxide film, the depth of etching is made to be shallower than the thickness d of the inner wall oxide film. As a result of this, the silicon substrate does not become exposed regardless of how deep the position of the top surface of the filled-in oxide film becomes due to the recess in a dish form created through CMP polishing.

This etching for height adjustment may be wet etching, such as etching using an HF liquid, or may be a dry etching, such as a plasma etching. In the etching using an HF liquid, only the filled-in oxide film is etched and silicon nitride film 4 is not etched. In addition, when dry etching is used for height adjustment of the filled-in oxide film, not only filled-in oxide film 8 but, also, silicon nitride film 4 is etched. In any case, as long as the depth of etching in the filled-in oxide film is no greater than the thickness d of the inner wall oxide film, the silicon substrate does not become exposed at the point in time after this etching.

In the case of dry etching, the silicon nitride film, the polycrystalline silicon film and the base silicon film are all etched. However, the sum of the thicknesses of base silicon oxide film 2, polycrystalline silicon film 3 and silicon nitride film 4 can be easily made thicker than the sum of the thickness of the inner wall oxide film and the thickness of filled-in oxide film in the above corners of the trench. Therefore, the silicon substrate does not become exposed at the point in time after the above described etching for height adjustment of the trench separation band (see FIG. 7).

When the silicon substrate is not exposed at the time of etching of the polycrystalline silicon, the silicon substrate is covered with inner wall oxide film 7. This inner wall oxide film is not reduced in thickness through the subsequent etching for removal of the polycrystalline silicon layer. Accordingly, the silicon substrate is not scooped out.

Figure 8:
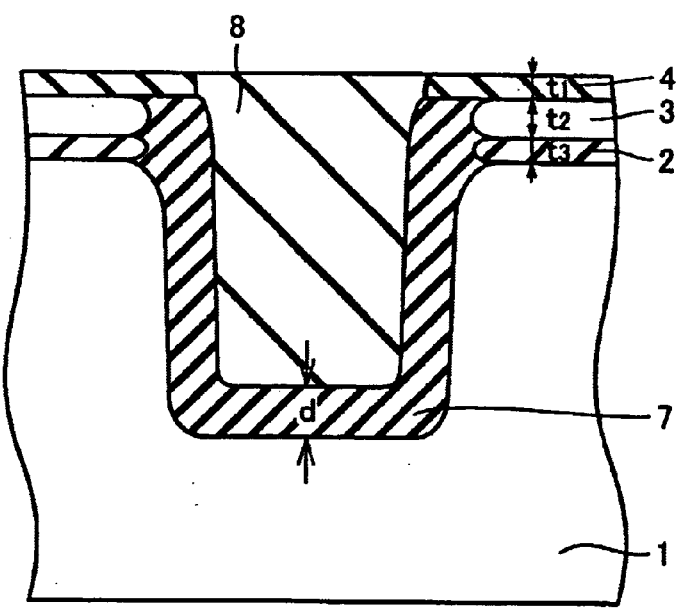
FIG. 8 is a cross section view at the stage when the filled in oxide layer and the silicon nitride layer are polished through CMP polishing at the time of formation of a trench separation band of the conventional width according to the first embodiment of the present invention.

A trench separation band of the conventional width is also formed at the same time as the formation of the above described wide trench separation band. FIG. 8 shows a cross section view at the stage when the filled-in oxide film is polished through CMP polishing in the trench of the conventional width. The filled-in oxide film of the conventional width is different from that of the wide trench in that a recess in a dish form does not occur therein. Therefore, the top surface of the filled-in oxide film 8 is in a plane in common with the top surface of silicon nitride layer 4. Accordingly, the top surface of the filled-in oxide film 8 is located in a position ($t_1+t_2+t_3$) higher than the surface of silicon substrate 1. Here, $t_1$ is the thickness of the silicon nitride layer, $t_2$ is the thickness of the polycrystalline silicon layer and $t_3$ is the thickness of the base silicon oxide layer.

Figure 9:
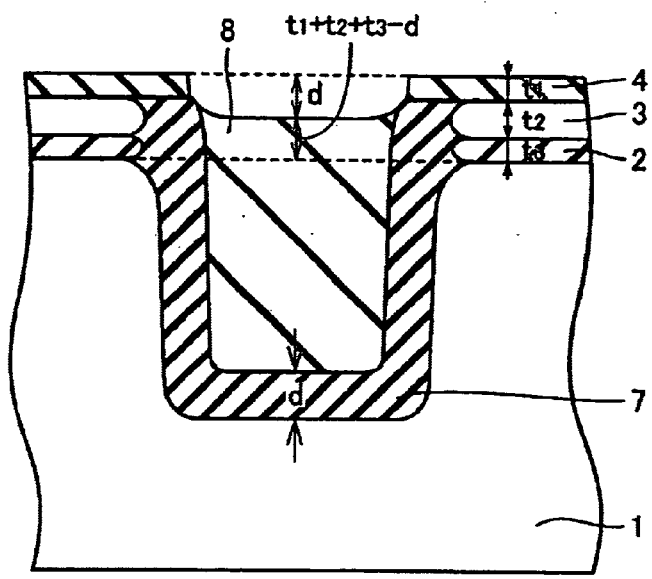
FIG. 9 is a cross section view at the stage when the filled-in oxide film of FIG. 8 is etched by an amount of the thickness of the inner wall oxide film for the purpose of height adjustment.

Next, etching is carried out on the filled-in oxide film for the purpose of height adjustment. In the present invention an amount of thickness no more than the thickness d of inner wall oxide film 7 is reduced through this etching for the purpose of height adjustment. FIG. 9 shows a view where etching is carried out so as to reduce the maximum amount to thickness d. In FIG. 9, the top surface of the filled-in oxide film 8 is located at a position ($t_1+t_2+t_3-d$) higher than the surface of silicon substrate 1. In a conventional etching for height adjustment, however, dispersion of wet etching is taken into consideration and the amount of etching is reduced by the maximum dispersion amount. For example, in the case that the thickness of the inner wall oxide film is 120 nm, usually etching is carried out to an amount approximately 20 nm thinner than the thickness of the inner wall silicon film. Accordingly, thickness $d_1$, which is reduced through the etching at this time, may be considered to be (d−20 nm).

Figure 10:
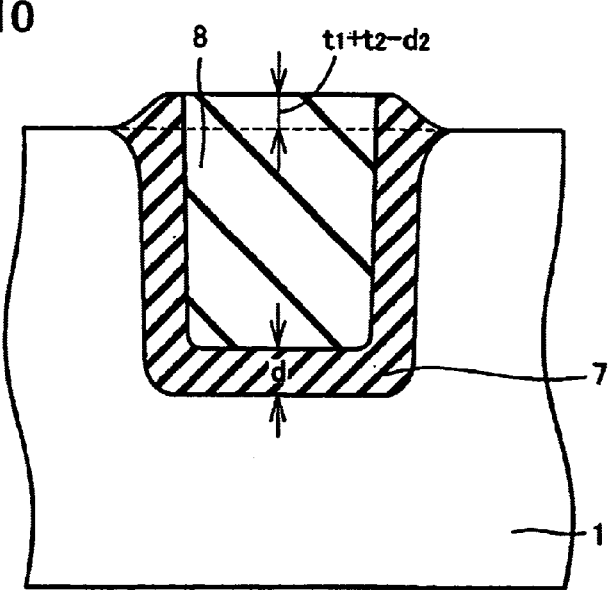
FIG. 10 is a cross section view at the stage when the silicon nitride layer, the polycrystalline silicon layer and the base silicon oxide layer on the silicon substrate of FIG. 9 are removed through etching.

Next, as shown in FIG. 10, silicon nitride layer 4, polycrystalline silicon layer 3 and base silicon oxide layer 2 on silicon substrate 1 are removed by using different etching liquids, respectively. The filled-in oxide film is formed of silicon oxide film. Therefore, the filled-in oxide film is slightly etched when etching is carried out to remove silicon nitride layer 4 and polycrystalline silicon layer 3. At the time of the etching off of base silicon oxide film 2, however, the filled-in oxide film is etched off by approximately the same thickness $t_3$ as of the base silicon oxide film. Therefore, the final height of the top surface of the filled-in oxide film from the silicon substrate surface becomes ($t_1+t_2-d_1$). The thickness of the silicon nitride layer, the thickness of the polycrystalline silicon layer, or the like, are set so that this height becomes the same desired height as in the prior art, which is approximately 50 nm, that is to say, in the range of 0 nm to 100 nm. Usually, $d_1$ is set to be smaller than thickness d of the inner wall oxide film by the maximum dispersion amount of wet etching. In addition, due to etching to remove silicon nitride layer 4 and polycrystalline silicon layer 3, and due to other cleaning processes, the filled-in oxide film is, practically, reduced in thickness and, therefore, ($t_1+t_2-d_1$) is set to be of a height that is no greater than the height of the desired filled-in oxide film, that is to say, it is set so as to be ($t_1+t_2-d_1$)≧(desired thickness). In other words, ($t_1+t_2$) is set to be higher than the height gained by adding a desired filled in thickness to the amount wet etching for height adjustment, that is to say, it is set so as to be ($t_1+t_2$)≧(desired height+$d_1$).

Furthermore, in other words, $(t_1+t_2)$ is set so as to be greater than the thickness of the inner wall oxide film by no smaller than the amount gained by subtracting the maximum dispersion amount of wet etching from the desired filled in height. For example, $(t_1+t_2)$ is set so as to be larger than the inner wall oxide film by no less than 30 nm. In addition, the above thickness $t_1$ of the substantial is the thickness after the overetching to the amount of approximately several % to 10% of the first thickness of the filled-in oxide film by means of a CMP polishing process and, therefore, the film is formed so as to include that amount.

Next, a concrete example of a trench separation band of the conventional width is described. In a trench of the conventional width, the height of the top surface of HDP film 8 is approximately 200 nm higher than the silicon substrate at the point in time after CMP polishing is carried out. After this, etching for height adjustment (d−20 nm) is carried out and, in addition, the base $SiO_2$ film is removed and, then, the top surface of the HDP film, which fills in the trench of the conventional width, is located approximately 50 nm higher than the silicon substrate surface. This height is, of course, the same height as of the trench separation band of a conventional width which is manufactured by a conventional process.

Accordingly, by manufacturing a trench separation band according to the process of the present invention, (a1) a wide trench separation band can, without fail, be formed without allowing the scooping out of the silicon substrate, or the like, to occur, irregardless of the trench width and (a2) a trench separation band of the conventional width can be formed of the height of the same level as in a prior art. Conventionally, since a trench separation band of a large width cannot be formed, dummy active regions, or the like, are formed by forming a complex photoresist pattern. According to the process of the present invention, a separation band of a necessary size can be easily formed in a necessary position. Therefore, the following effects can be gained.

(A1) A highly complex task on a CAD for designing a photoresist pattern can be omitted.

(A2) Conventionally, the positions for wires are limited in order to avoid a parasitic capacitance which occurs along with wiring. The parasitic capacitance can be avoided by providing a trench separation band for a large separation in the silicon substrate immediately below the wires according to the process of the present invention. Therefore, the freedom of design of the wiring pattern can be enhanced.

(A3) Furthermore, in the case that a plurality of wires are arranged in parallel, dummy active regions are conventionally provided between the wires. It becomes unnecessary to provide dummy active regions since a trench separation band of a great width is provided directly beneath the above described wires. Therefore, it becomes possible to miniaturize the size of the semiconductor chip.

(Second Embodiment)

Figure 11:
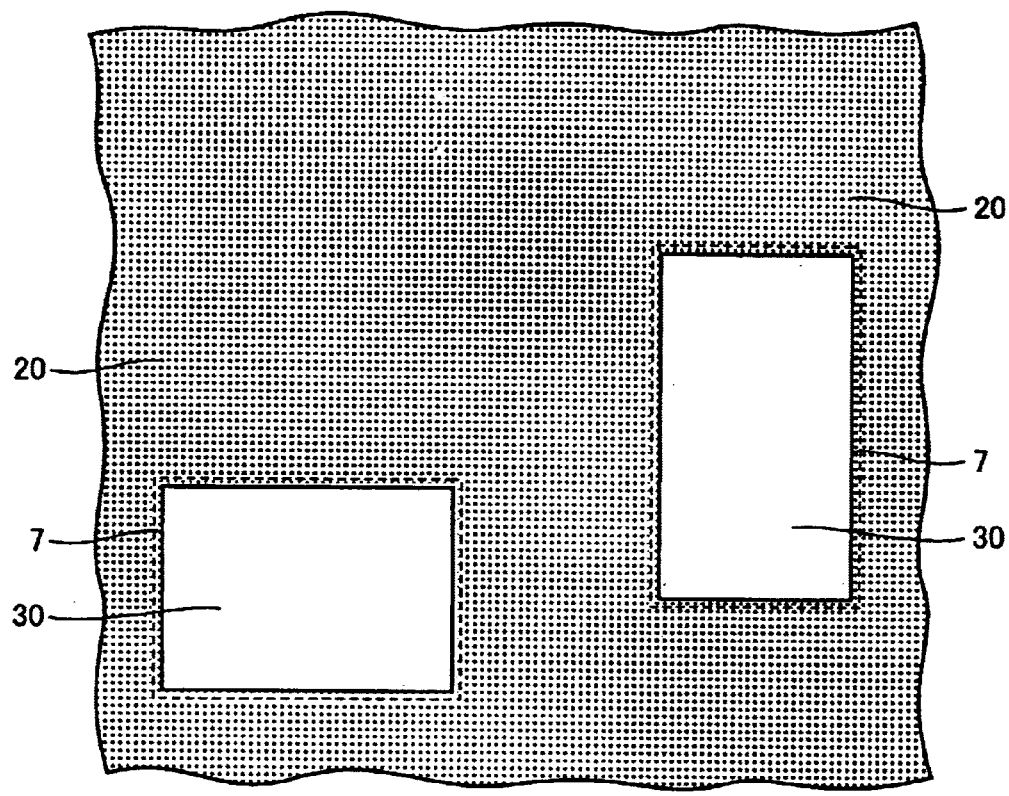
FIG. 11 is a schematic view for describing a semiconductor device according to a second embodiment of the present invention.

Referring to FIG. 11, active regions 30 in which semiconductor elements are formed are surrounded by a wide trench separation band. Inner wall oxide film 7 is formed on the walls of the trench surrounding these active regions 30. This inner wall oxide film 7 works as a protective film for preventing the silicon substrate from being exposed at the time of etching for height adjustment or etching for removal of the base silicon oxide film during the formation of the wide trench separation band 20.

A process of forming the wide trench separation band in FIG. 11 is the same as the process for a wide trench separation band in the first embodiment as shown in the following.

(S1) A multilayer film made of a base silicon oxide film/polycrystalline silicon film/silicon nitride film is formed on a silicon substrate.

(S2) A wide trench is created in the silicon substrate by manufacturing a photoresist pattern for the wide trench separation band.

(S3) An inner wall silicon oxide film is formed on the inner walls of the wide trench.

(S4) A filled in silicon oxide film is formed so as to fill in the wide trench.

(S5) The silicon nitride film is exposed by polishing the filled in silicon oxide film and the silicon nitride film through a CMP polishing process. The polishing is adjusted so that, at the point in time of the completion of the CMP polishing, the sum of (thickness $t_1$ of silicon nitride film)+(thickness $t_2$ of polycrystalline silicon film) is the sum of the "thickness d of inner wall oxide film" and the "height gained by subtracting the maximum dispersion of the etching for height adjustment from the desired height of the trench separation," or more.

(S6) When etching for height adjustment of the filled in silicon oxide film is carried out, the filled in silicon oxide film is etched off by an amount not greater than the thickness of the above inner wall oxide film.

(S7) Etching is carried out the remove the multilayer film.

The above described process for a wide trench separation band is applied to the entirety of the wide trench separation bands in the embodiments of the present invention.

Figure 27:
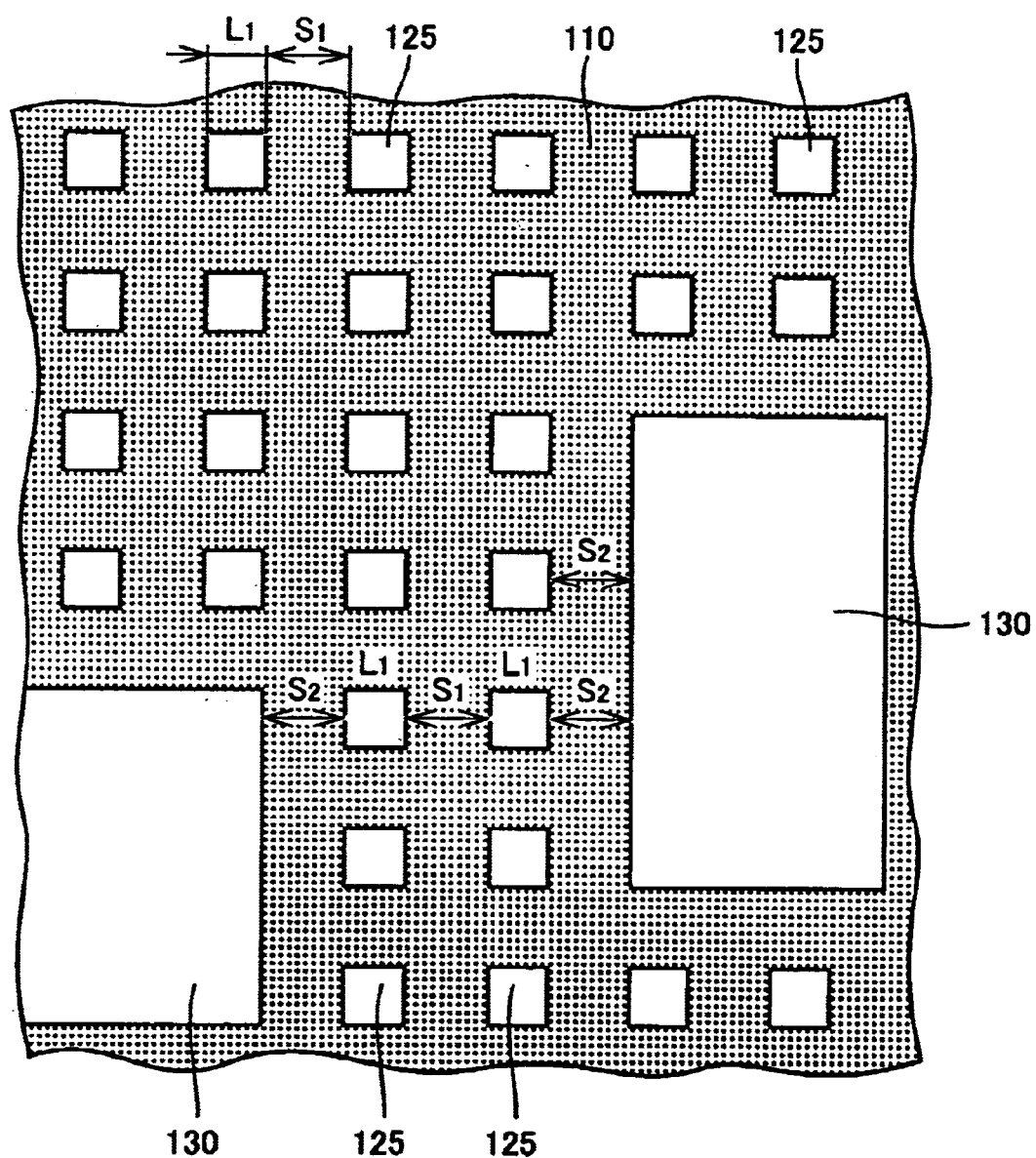
FIG. 27 is a plan view showing a structure wherein a number of dummy active regions are aligned in a separation region surrounding active regions in which semiconductor elements are formed in a conventional semiconductor device.

Conventionally, as shown in FIG. 27, a wide trench separation band cannot be formed in the case that the intervals between the active regions wherein semiconductor elements are provided are wide. Therefore, as described above, a number of dummy active regions of a complex pattern are provided. By forming a wide trench separation region according to the process of the present invention, it becomes unnecessary to manufacture a complex photoresist pattern wherein a number of dummy active regions are arranged. Therefore, the time consuming task of manufacturing a photoresist pattern by using a CAD can be eliminated. In addition, in comparison with the process steps of forming the above described dummy active regions, the process steps of forming the wide trench separation band of the present invention do not include a complex pattern and the process steps are simple. As a result of this, reduction of manufacturing cost due to the omission of a complex task with CAD is achieved and the production yield can be increased.

(Third Embodiment)

Figure 12:
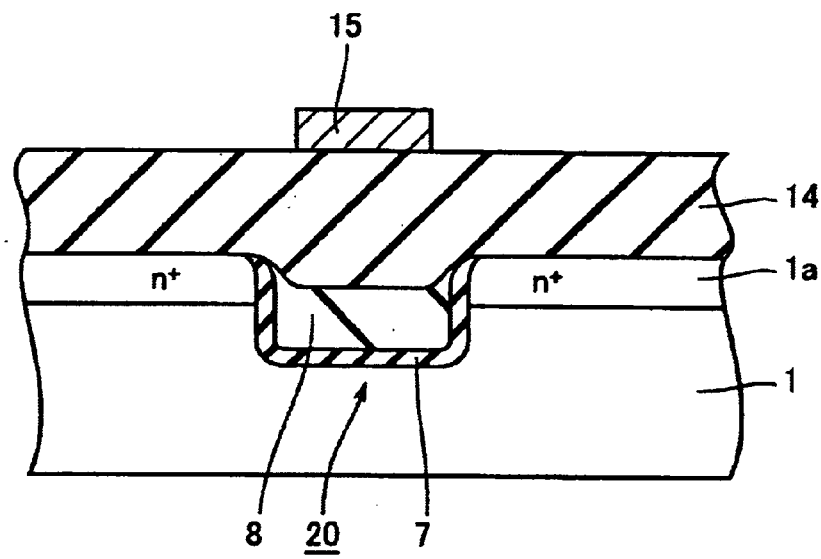
FIG. 12 is a schematic view for describing a semiconductor device according to a third embodiment of the present invention.

In FIG. 12 a film wire 15 is formed so as to contact an interlayer insulating film 14. Film wire 15 is a wide conductor in a semiconductor device. Therefore, in the case that a separation band is not directly beneath the film wire, there is the risk of the occurrence of a parasitic capacitance which cannot be ignored between impurity regions 1*a*, within silicon substrate 1, and film wire 15.

As shown in FIG. 12, however, the thickness of the dielectric layer between the film wires 15 and silicon substrate can be made sufficiently thick by providing a wide trench separation band 20 directly beneath film wire 15 along the film wire. Therefore, a film wire can be arranged so as not to entail a risk of the occurrence of a parasitic capacitance. As a result of this, it becomes possible to increase the freedom of the wiring pattern to a great degree in the design of a semiconductor device.

Figure 13:
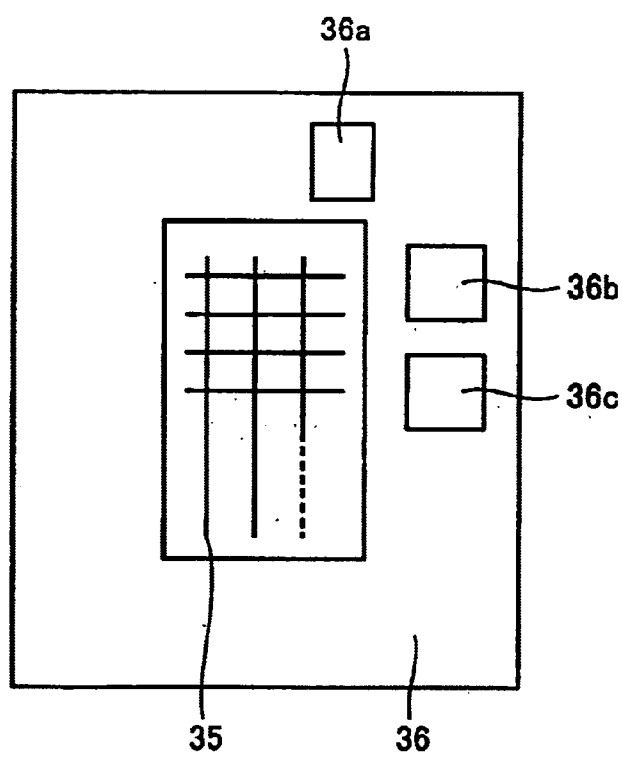
FIG. 13 is schematic view for describing a region wherein a wide trench separation band of a semiconductor device according to the third embodiment of the present invention is arranged.

The above described wide trench separation band for prevention of parasitic capacitance due to a wire is used, for example, in periphery region 36 which surrounds a memory array 35 of a semiconductor memory device shown in FIG. 13. This periphery region is provided with decoder regions 36a, 36b and a sense amplifier region 36c and there are some cases where a parasitic capacitance is recognized to have occurred along with wires in these regions. Conventionally in the case that a wide trench separation band cannot easily be formed, the wiring pattern is changed so that wires do not run above impurity regions 1a in order to prevent the occurrence of a parasitic capacitance. The wires occupy a large area in a semiconductor device and, therefore, the above described limitation of the wiring pattern makes the design of the semiconductor device difficult when the semiconductor device is required to be miniaturized. The present invention removes the above described limitation concerning the design of wires so as to greatly increase the freedom of the design of the wiring pattern.

(Fourth Embodiment)

Figure 14:
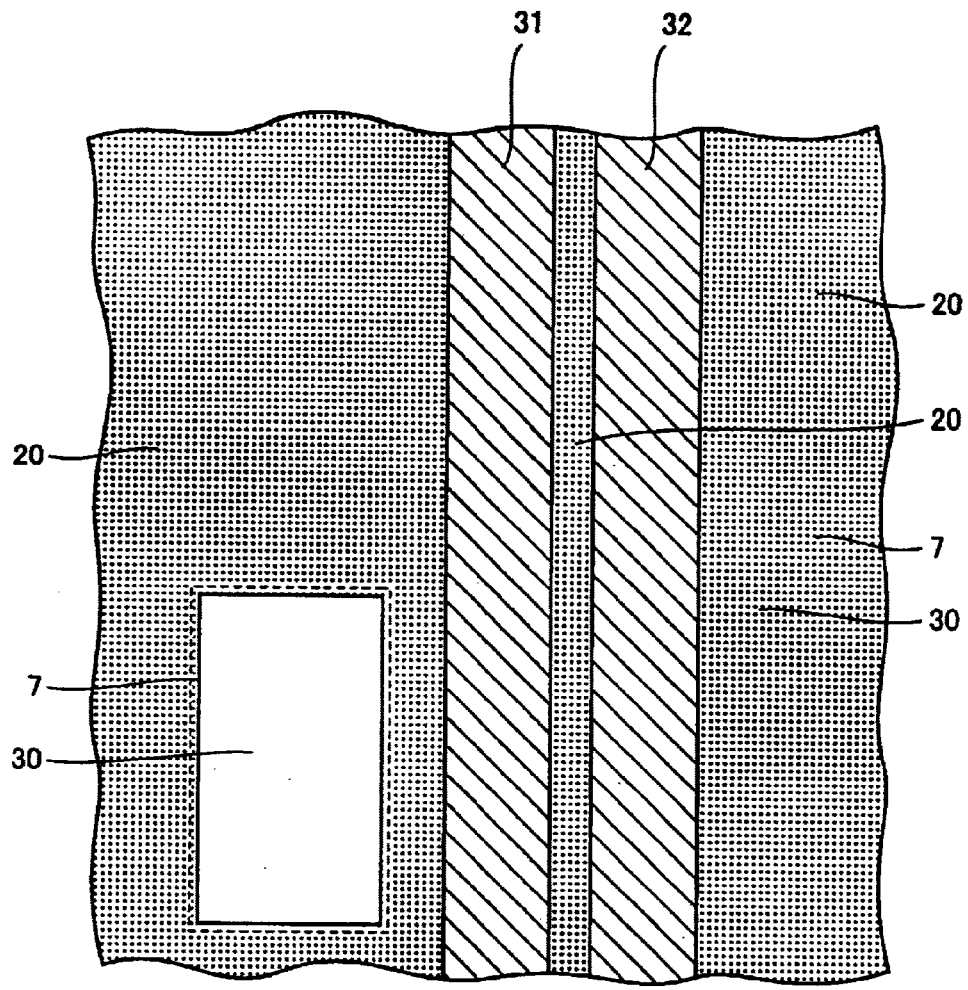
FIG. 14 is a schematic view for describing a semiconductor device according to a fourth embodiment of the present invention.
Figure 15:
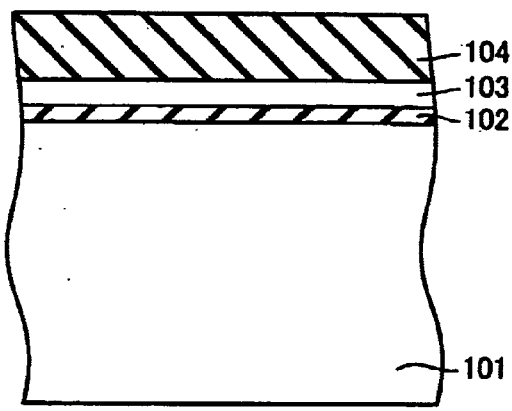
FIG. 15 is a cross section view at the stage when a base silicon oxide layer, polycrystalline silicon layer and a silicon nitride layer are sequentially formed so as to contact the top surface of the silicon substrate in a method of manufacturing a semiconductor device according to a prior art.
Figure 16:
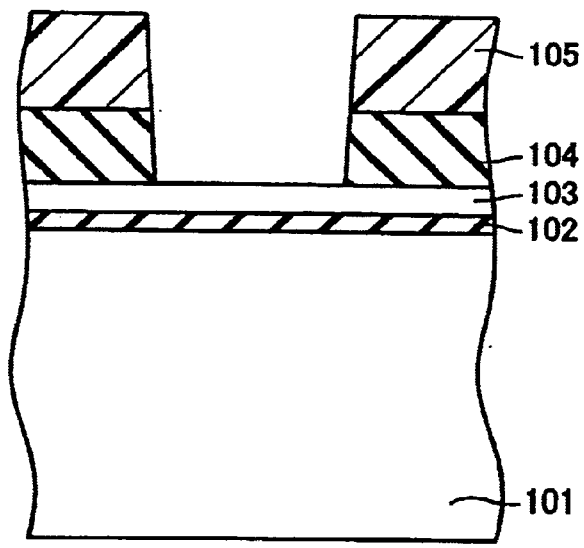
FIG. 16 is a cross section view at the stage when the silicon nitride layer is etched by arranging a photoresist pattern on the silicon substrate of FIG. 15.
Figure 17:
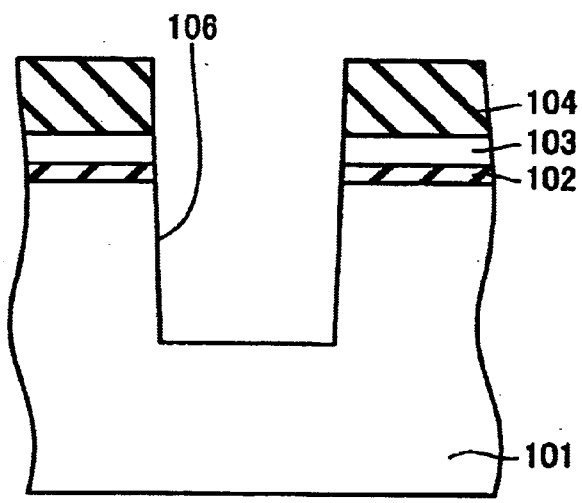
FIG. 17 is a cross section view at the stage when a trench of the conventional width is provided in the silicon substrate of FIG. 15.
Figure 18:
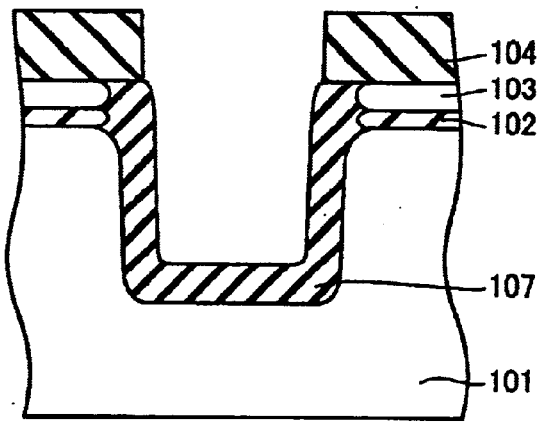
FIG. 18 is a cross section view at the stage when an inner wall oxide film is formed on the surface within the trench of FIG. 17.
Figure 19:
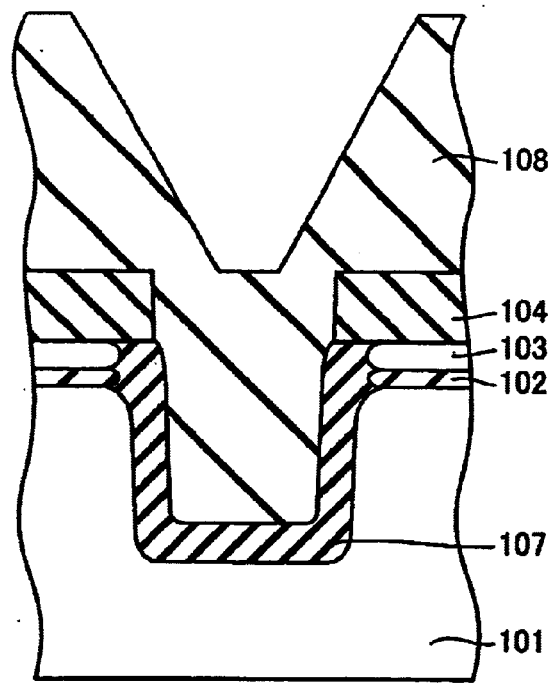
FIG. 19 is a cross section view at the stage when a filled-in oxide film is filled into the trench of the conventional width in a method of manufacturing a semiconductor device according to a prior art.
Figure 20:
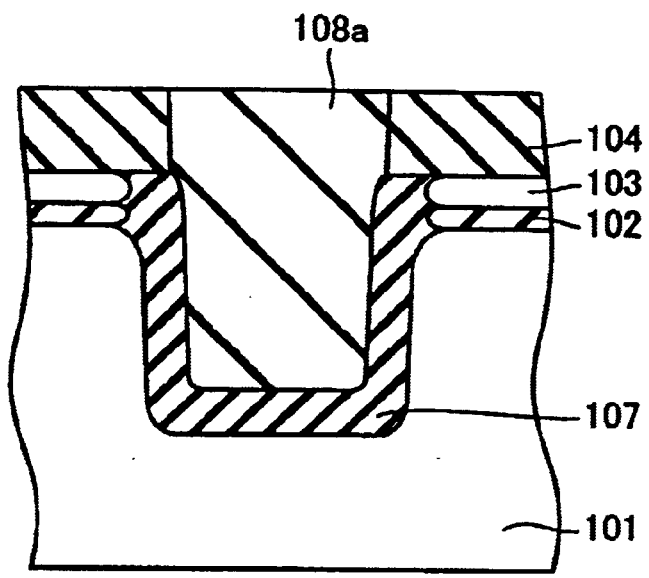
FIG. 20 is a cross section view at the stage when the filled-in oxide film on the silicon substrate of FIG. 19 is polished through CMP polishing.
Figure 21:
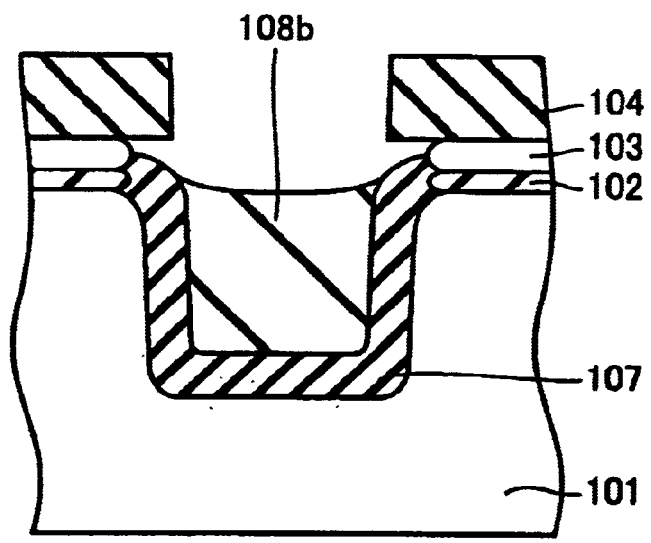
FIG. 21 is a cross section view at the stage when the filled-in oxide film on the silicon substrate of FIG. 20 is etched for the purpose of height adjustment.
Figure 22:
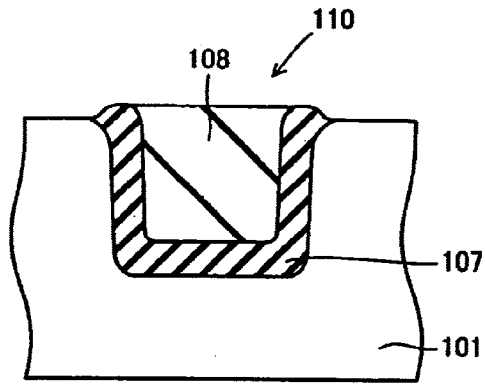
FIG. 22 is a cross section view at the stage when the base silicon oxide layer/polycrystalline silicon layer/silicon nitride layer is removed from the silicon substrate of FIG. 21.
Figure 23:
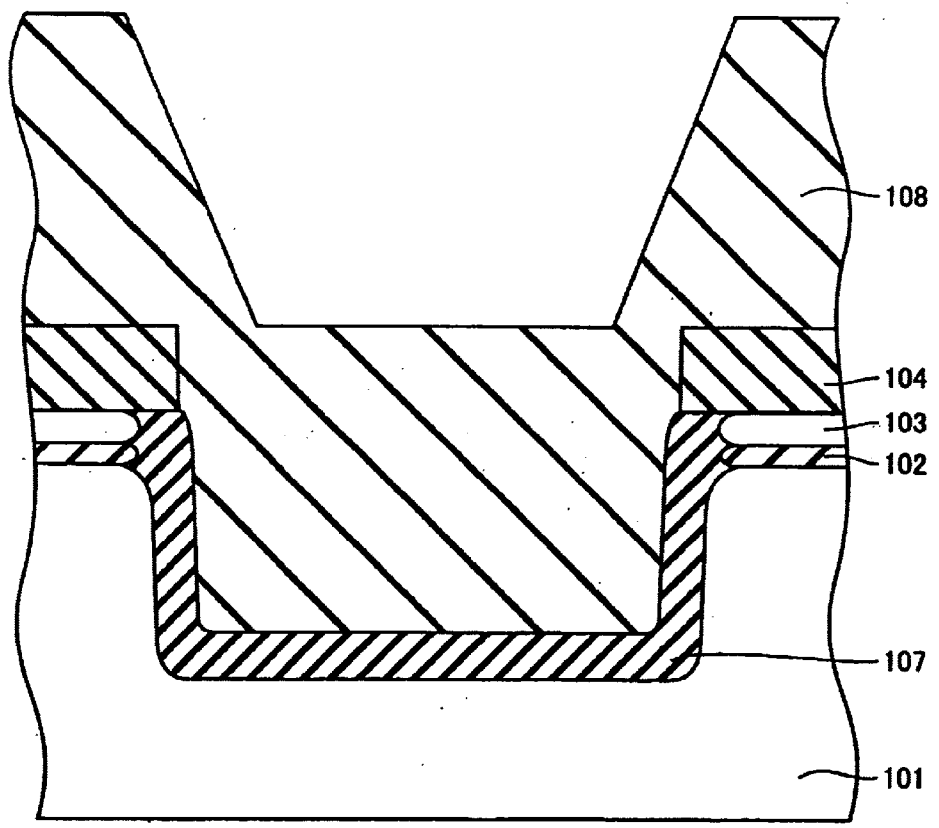
FIG. 23 is a cross section view at the stage when a wide trench is filled in with a filled-in oxide film in a method of manufacturing a semiconductor device according to a prior art.
Figure 24:
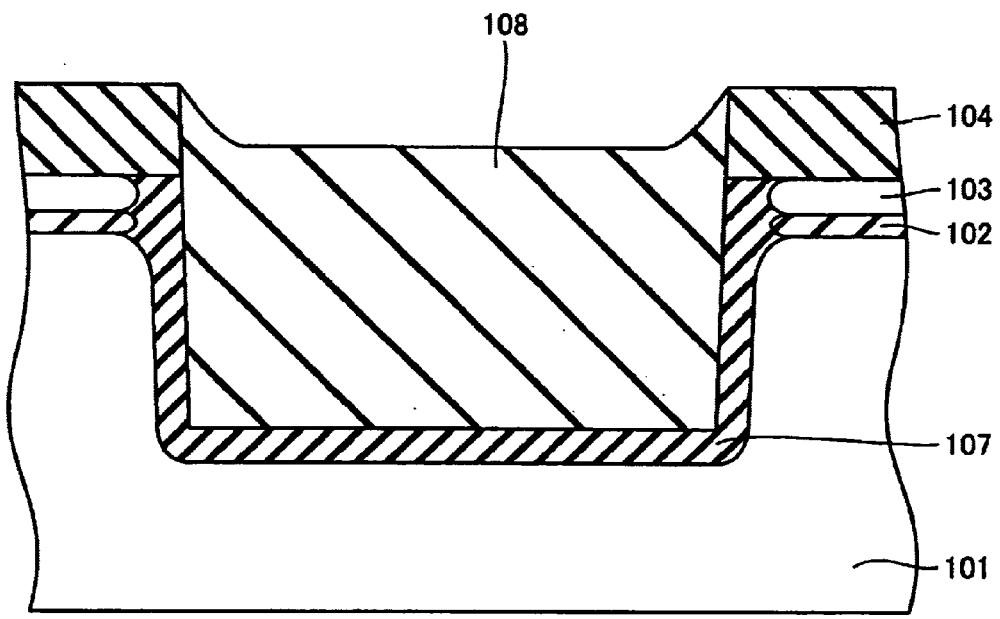
FIG. 24 is a cross section view at the stage when a CMP polishing process is carried out on the filled-in oxide film and on the silicon nitride layer which are on the silicon substrate of FIG. 23.
Figure 25:
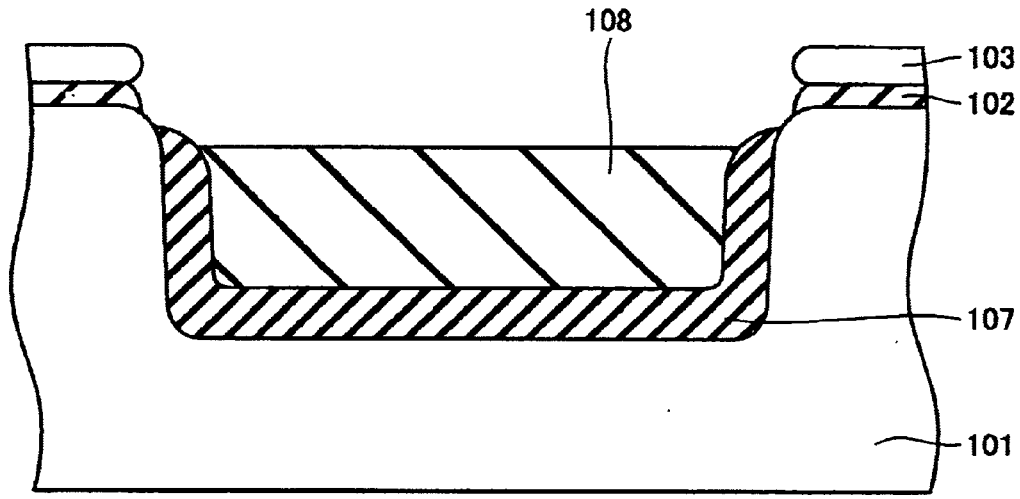
FIG. 25 is a cross section view at the stage when the silicon substrate is exposed by etching the filled-in oxide film on the silicon substrate of FIG. 24 for the purpose of height adjustment.
Figure 26:
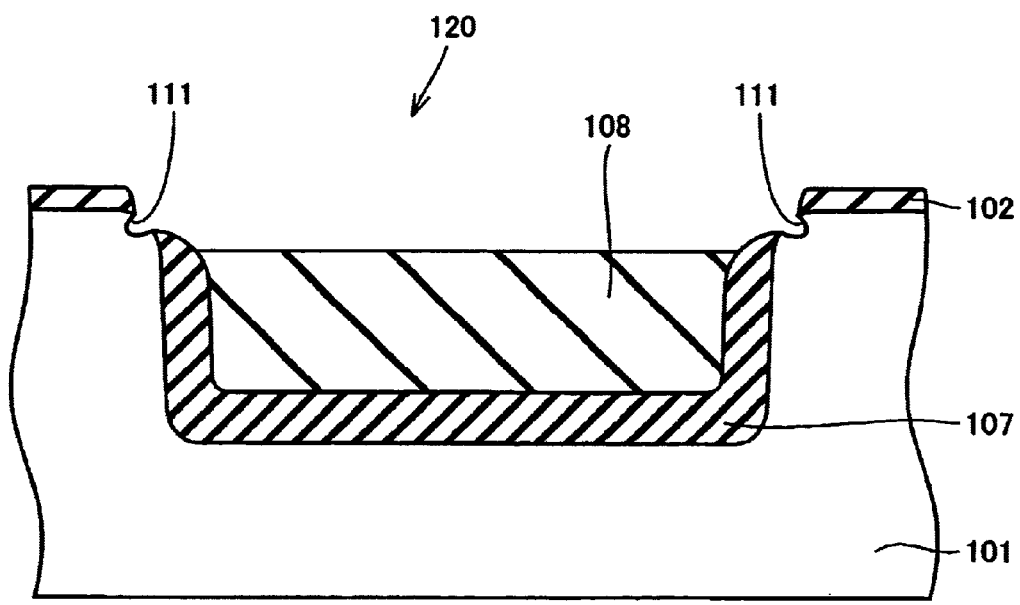
FIG. 26 is a cross section view at the stage when etching is carried out in order to remove the polycrystalline silicon layer from the silicon substrate of FIG. 25.

In FIG. 14 two wires 31, 32 are arranged in parallel. These wires 31, 32 are formed so as to contact the top surface of the interlayer insulating film arranged on the silicon substrate in the same manner as wire 15 shown in FIG. 12. In the same manner as in the case of FIG. 11, inner wall oxide film 7 is formed around active regions 30 in the silicon substrate where semiconductor device elements are formed.

Figure 28:
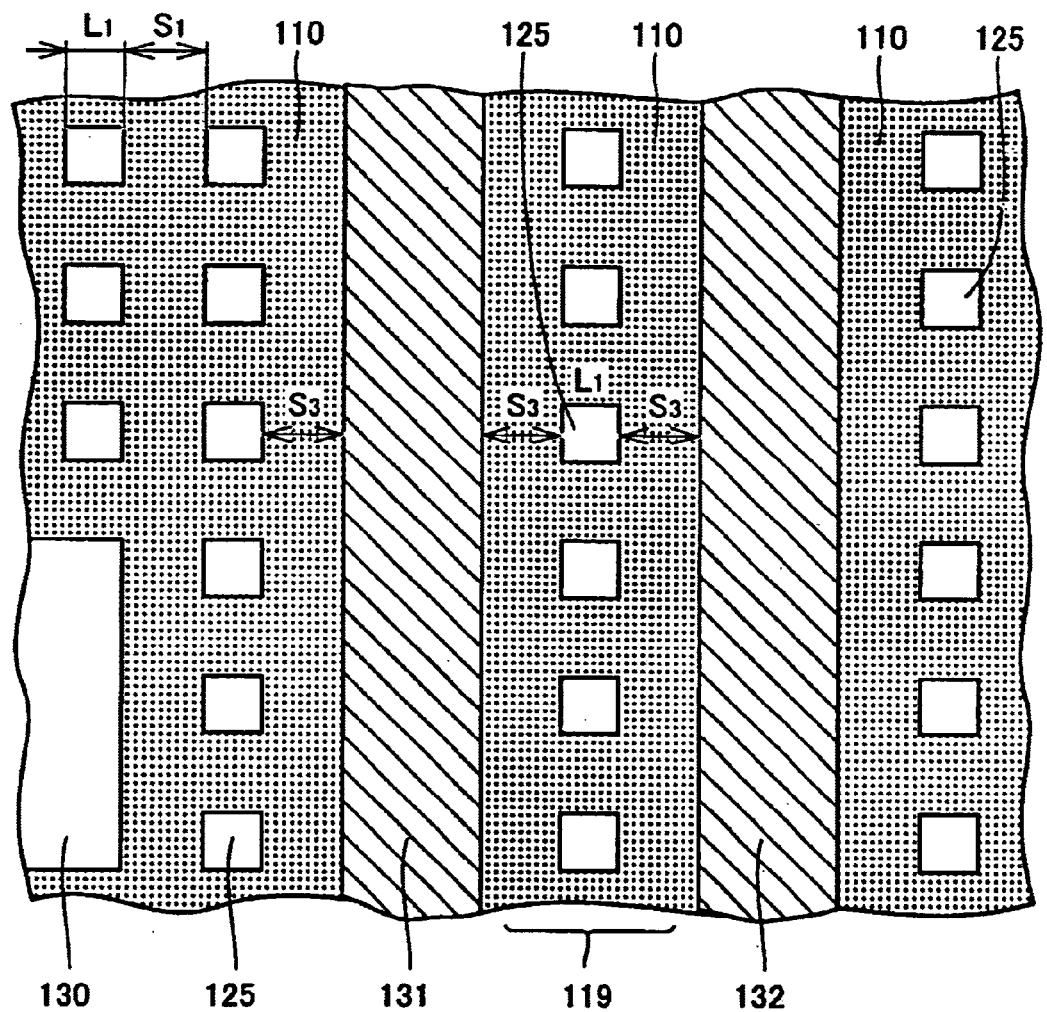
FIG. 28 is a plan view showing a structure wherein a number of dummy active regions are aligned in the silicon substrate beneath two wires in a conventional semiconductor device.

As shown in FIG. 14, two wires 31, 32 have the minimum interval that can prevent a short circuit of the wires in the semiconductor device according to a fourth embodiment of the present invention. In the conventional semiconductor device shown in FIG. 28, a dummy active region of the width $(2S_3+L_1)$ which is larger than the minimum interval necessary to prevent a short circuit is provided between the two wires in the plan view.

By providing a wide trench separation band according to the process of the present invention, however, it becomes unnecessary to provide a region of useless width $(2S_2+L_1)$ between the above described wires. Therefore, miniaturization of the semiconductor device can be furthered. In addition, the freedom of the wiring layout can be increased. It is possible to make this increase in the freedom of layout advantageously contribute to, for example, the miniaturization of the semiconductor device.

Here, the above described two wires may be close to each other so as to have the minimum interval necessary to prevent a short circuit by allowing an insulating layer to intervene. In addition, in the case that division into two wires is not necessary, they may be integrated into one wire.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising the steps of:
    forming a multilayer film, which includes a silicon oxide layer, a polycrystalline silicon layer having a thickness, above the silicon oxide layer and a silicon nitride layer having a first thickness, above the polycrystalline silicon layer, on a main surface of a silicon substrate;
    patterning said multilayer film and etching a trench for element separation in said silicon substrate;
    forming an inner wall silicon oxide film at a thickness which covers inner walls of said trench by oxidizing the inner wall surfaces which include sidewalls of said multilayer film;
    forming a trench oxide layer so as to fill in the trench which is covered with said inner wall silicon oxide film and so as to contact a top surface of said silicon nitride layer;
    polishing said trench oxide layer and said silicon nitride layer through CMP polishing reducing the first thickness of said silicon nitride layer to a second thickness leaving an upper surface of the silicon nitride layer exposed and forming a recess in the trench oxide layer such that an upper surface of the trench oxide is below the upper surface of the silicon nitride layer;
    etching the trench oxide layer after, CMP polishing to reduce the height by an amount no greater than the thickness of said inner wall silicon oxide film for the purpose of height adjustment of a trench separation band.

2. The method of manufacturing a semiconductor device according to claim 1, wherein the sum of the second thickness of the silicon nitride layer and the thickness of said polycrystalline silicon layer is larger than the thickness of said inner wall silicon oxide film by no smaller than the amount gained by subtracting the amount of height reduction of the trench oxide layer after etching for the purpose of height adjustment of the trench separation from a predetermined separation height.

3. The method of manufacturing a semiconductor device according to claim 1, wherein said silicon nitride layer is formed so as to include the amount of thickness which is to be removed through said CMP polishing.

4. The method of manufacturing a semiconductor device according to claim 1, wherein said trench oxide layer is formed so that the etching rate of said trench oxide film in said etching for height adjustment is greater than the etching rate of said inner wall silicon oxide film.

5. The method of manufacturing a semiconductor device according to claim 1, wherein an oxide layer is formed by means for an HDP (high density plasma) method in the formation of said trench oxide layer.

6. The method of manufacturing a semiconductor device according to claim 1, wherein fluoric acid is used for said etching that is carried out for the purpose of height adjustment of the trench separation band.

7. The method of manufacturing a semiconductor device according to claim 1, wherein said trench is, in a large separation band region of the silicon substrate which includes at least one active region in the plan view, created by etching a separation region between active region external periphery walls, which are formed along the peripheries of respective active regions included in said large separation band region, and inner periphery walls of the large separation band region, and said inner walls silicon oxide film is formed on said active region external periphery walls and on said inner periphery walls of the large separation band region so that said trench oxide layer is formed so as to fill in said trench.

8. A semiconductor device manufactured in accordance with the method of claim 7, wherein
    said trench separation band comprises a first trench separation band portion and a second trench separation band portion which is greater than said first trench separation band portion.

9. The method of manufacturing a semiconductor device according to claim 1, wherein said trench is created in said silicon substrate in a band form which includes interconnection films which contact a top surface of the interlayer insulating film on the silicon substrate in the plan view.

10. The method of manufacturing a semiconductor device according to claim 9, wherein said wires are first and second wire arranged in parallel and said trench is created as a region in a band form which includes said first and second wires in the plan view.

11. A semiconductor device manufactured in accordance with the method of claim 10, wherein said trench separation band comprises a first trench separation band portion and a second trench separation band portion which is wider than said first trench separation band portion.

12. A semiconductor device manufactured in accordance with the method of claim 9, wherein said trench separation band comprises a first trench separation band portion and a second trench separation band portion which is wider than said first trench separation band portion.

13. A semiconductor device manufactured in accordance with the method of claim 1, wherein said trench separation band comprises a first trench separation band portion and a second trench separation band portion which is wider than said first trench separation band portion.

* * * * *